United States Patent
Samuel et al.

(10) Patent No.: US 11,984,183 B2
(45) Date of Patent: May 14, 2024

(54) SYSTEMS AND METHODS FOR FAULT-RESILIENT SYSTEM MANAGEMENT RANDOM ACCESS MEMORY

(71) Applicant: Dell Products L.P., Round Rock, TX (US)

(72) Inventors: Balasingh P. Samuel, Round Rock, TX (US); Michael W. Arms, Copperas Cove, TX (US); Vivek Viswanathan Iyer, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/590,214

(22) Filed: Feb. 1, 2022

(65) Prior Publication Data
US 2023/0245709 A1 Aug. 3, 2023

(51) Int. Cl.
*G11C 29/46* (2006.01)
*G06F 11/20* (2006.01)

(52) U.S. Cl.
CPC .......... *G11C 29/46* (2013.01); *G06F 11/2094* (2013.01)

(58) Field of Classification Search
None
See application file for complete search history.

(56) References Cited

U.S. PATENT DOCUMENTS

| 7,747,848 B1 * | 6/2010 | Nallagatla | G06F 8/654 713/1 |
| 2005/0018497 A1 * | 1/2005 | Frankowsky | G11C 29/72 365/200 |
| 2009/0172661 A1 * | 7/2009 | Zimmer | G06F 9/45558 718/1 |
| 2012/0036308 A1 * | 2/2012 | Swanson | G06F 12/1433 711/170 |
| 2013/0051158 A1 * | 2/2013 | Matsuo | G11C 29/24 365/189.07 |
| 2013/0232384 A1 * | 9/2013 | Yoel | G11C 29/24 714/710 |

(Continued)

FOREIGN PATENT DOCUMENTS

| CN | 105745623 A * | 7/2016 | ............ G06F 11/263 |
| WO | WO-2007064781 A2 * | 6/2007 | .......... G06F 11/1446 |

(Continued)

*Primary Examiner* — Guerrier Merant
(74) *Attorney, Agent, or Firm* — Jackson Walker L.L.P.

(57) ABSTRACT

A method may include, during a PEI phase BIOS, responsive to a flag being set in a previous boot session of an information handling system to test a first designated region of a memory of the information handling system: testing the first designated region for a memory fault; in response to detecting the memory fault, mapping out the first designated region and designating an additional region of the memory as a designated region for SMRAM and repeating testing of additional designated regions, mapping out of failed additional designated regions, and designating new additional regions of the memory until a designated region passes testing without memory fault; and in response to detecting passage of testing without memory fault of a designated region comprising either of the first designated region or an additional region of the memory, configuring the designated region for use as the SMRAM for the information handling system.

12 Claims, 2 Drawing Sheets

(56) References Cited

U.S. PATENT DOCUMENTS

2016/0041878 A1* 2/2016 Davis .................. G06F 11/1666
714/6.13
2019/0237153 A1* 8/2019 Hong ................. G11C 16/0408

FOREIGN PATENT DOCUMENTS

| WO | WO-2017131635 A1 * | 8/2017 | ............. | G06F 21/53 |
| WO | WO-2020159533 A1 * | 8/2020 | ............. | G06F 21/34 |

* cited by examiner

SYSTEMS AND METHODS FOR FAULT-RESILIENT SYSTEM MANAGEMENT RANDOM ACCESS MEMORY

TECHNICAL FIELD

The present disclosure relates in general to information handling systems, and more particularly to methods and systems for ensuring fault-resilience in a system management random access memory (SMRAM) in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Self-healing and proactive remediation of memory regions is often desirable in response to faults occurring in memory. However, existing approaches to performing self-healing and proactive remediation in SMRAM are lacking. Accordingly, faults occurring in SMRAM may lead at first to slower boot times as portions of SMRAM with faults are remediated through standard cyclic-redundancy checks, and eventually lead to boot failures of a basic input/output system when faults are no longer correctable with cyclic-redundancy checks. Boot failures can lead to significant downtime, as they often require replacement of a memory module (e.g., a dual-inline memory module) in order to again enable successful boot. Accordingly, methods and systems for enabling self-healing and proactive remediation of SMRAM are desirable.

SUMMARY

In accordance with the teachings of the present disclosure, the disadvantages and problems associated with remediating memory faults in SMRAM may be reduced or eliminated.

In accordance in with embodiments of the present disclosure, an information handling system may include a processor, a memory communicatively coupled to the processor, and a basic input/output system communicatively coupled to the processor and comprising a program of executable instructions configured to, during a Pre-Extensible Firmware Interface Initialization (PEI) phase of the basic input/output system, responsive to a flag being set in a previous boot session to test a first designated region of the memory for System Management Random Access Memory (SMRAM): test the first designated region for a memory fault; in response to detecting the memory fault, map out the first designated region and designate an additional region of the memory as a designated region for SMRAM and repeat testing of additional designated regions, mapping out of failed additional designated regions, and designating new additional regions of the memory until a designated region passes testing without memory fault; and in response to detecting passage of testing without memory fault of a designated region comprising either of the first designated region or an additional region of the memory, configure the designated region for use as the SMRAM for the information handling system.

In accordance in with these and other embodiments of the present disclosure, a method may include, during a Pre-Extensible Firmware Interface Initialization (PEI) phase of a basic input/output system of an information handling system, responsive to a flag being set in a previous boot session of the information handling system to test a first designated region of a memory of the information handling system, the first designated region to be used for System Management Random Access Memory (SMRAM): testing the first designated region for a memory fault; in response to detecting the memory fault, mapping out the first designated region and designating an additional region of the memory as a designated region for SMRAM and repeating testing of additional designated regions, mapping out of failed additional designated regions, and designating new additional regions of the memory until a designated region passes testing without memory fault; and in response to detecting passage of testing without memory fault of a designated region comprising either of the first designated region or an additional region of the memory, configuring the designated region for use as the SMRAM for the information handling system.

In accordance in with these and other embodiments of the present disclosure, an article of manufacture may include a non-transitory computer-readable medium and computer-executable instructions carried on the computer-readable medium, the instructions readable by a processor, the instructions, when read and executed, for causing the processor to, during a Pre-Extensible Firmware Interface Initialization (PEI) phase of a basic input/output system of an information handling system, responsive to a flag being set in a previous boot session of the information handling system to test a first designated region of a memory of the information handling system, the first designated region to be used for System Management Random Access Memory (SMRAM): test the first designated region for a memory fault; in response to detecting the memory fault, map out the first designated region and designate an additional region of the memory as a designated region for SMRAM, and repeat testing of additional designated regions, mapping out of failed additional designated regions, and designating new additional regions of the memory until a designated region passes testing without memory fault; and in response to detecting passage of testing without memory fault of a designated region comprising either of the first designated region or an additional region of the memory, configuring the designated region for use as the SMRAM for the information handling system.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
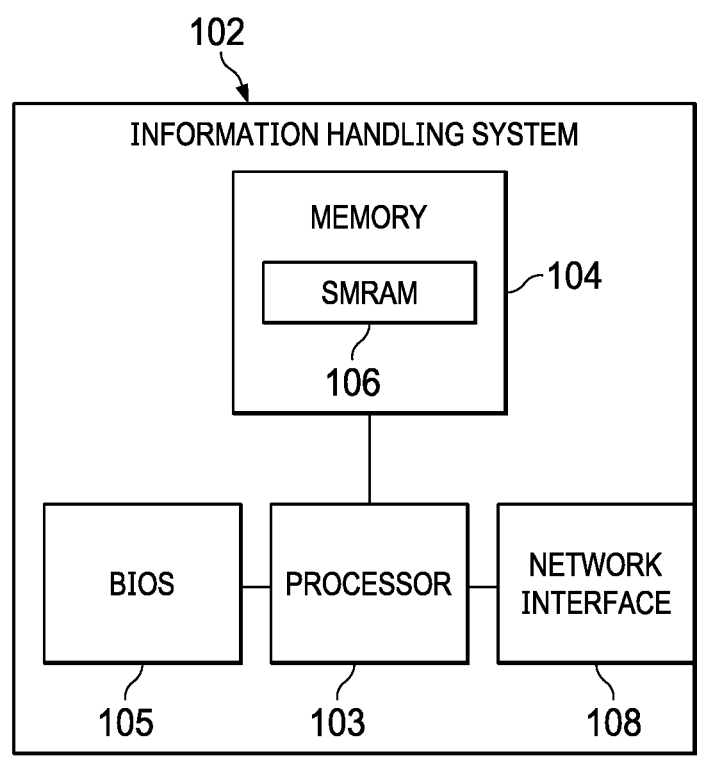
FIG. 1 illustrates a block diagram of an information handling system, in accordance with embodiments of the present disclosure.
Figure 2:
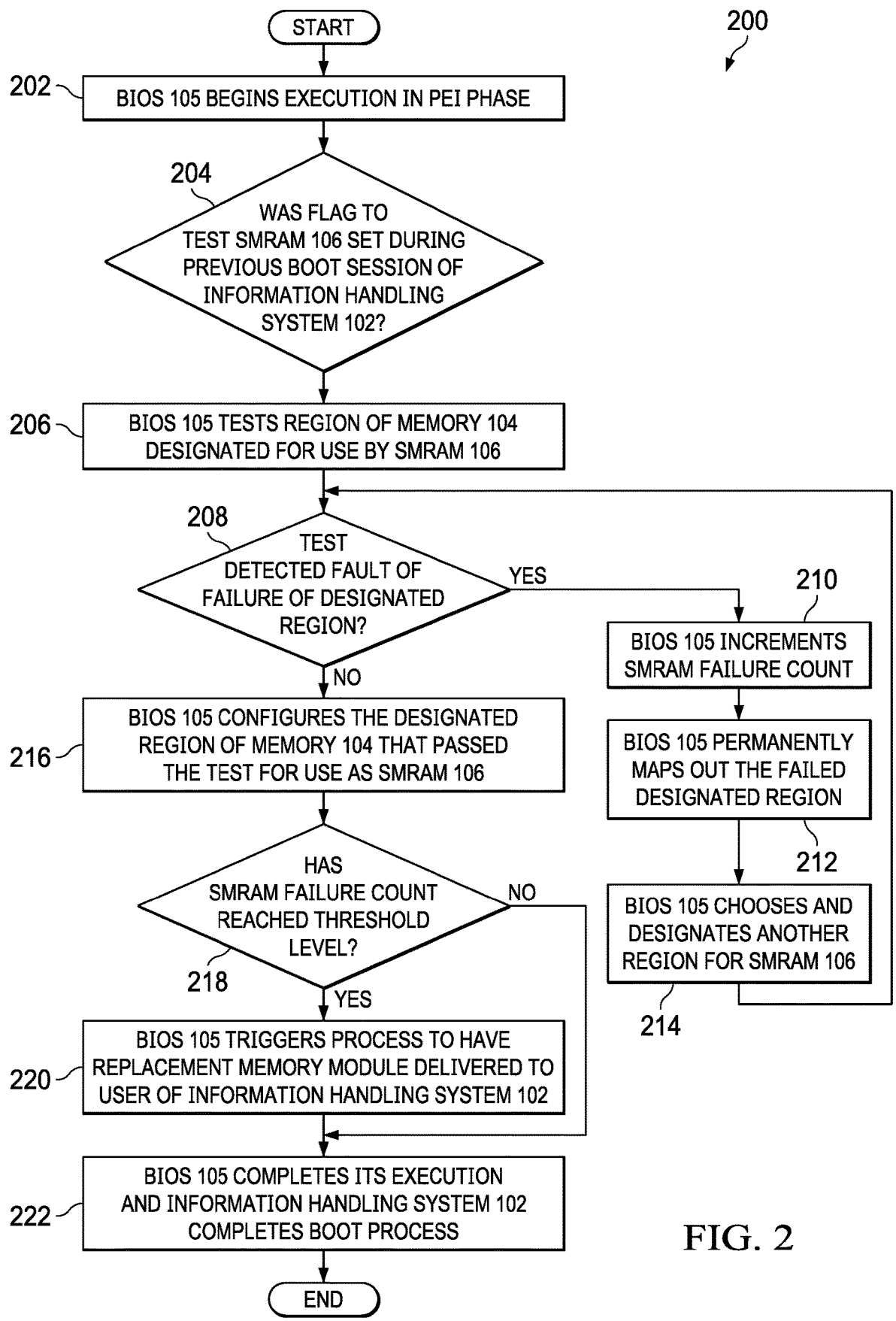
FIG. 2 illustrates a flowchart of an example method for ensuring fault-resilience in an SMRAM, in accordance with embodiments of the present disclosure.

Preferred embodiments and their advantages are best understood by reference to FIGS. 1 and 2, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, an information handling system 102 may comprise a personal computer. In some embodiments, an information handling system 102 may comprise or be an integral part of a server. In other embodiments, an information handling system 102 may comprise a portable information handling system (e.g., a laptop or notebook, etc.). As depicted in FIG. 1, an information handling system 102 may include a processor 103, a memory 104 communicatively coupled to processor 103, a BIOS 105 communicatively coupled to processor 103, and a network interface 108 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may include a portion of memory designated as SMRAM 106. SMRAM 106 may be used by a System Management Mode (SMM) of information handling system 102. SMM is a special-purpose operating mode provided for information handling system-wide functions such as power management, system hardware control, or proprietary vendor-designed code. It is typically intended for use only by system firmware (a basic input/output system), but not by applications software or general-purpose systems software. SMM may offer a distinct and easily-isolated processor environment that operates transparently to the operating system or executive and software applications.

In order to achieve transparency, SMM imposes certain rules. For example, SMM may typically only be entered through a System Management Interrupt (SMI). Processor 103 may execute SMM code in a separate address space of memory 104 (i.e., SMRAM 106) that may be configured by system firmware to be inaccessible to other operating modes of processor 103.

BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102.

Network interface 108 may comprise any suitable system, apparatus, or device operable to serve as an interface between information handling system 102 and one or more other information handling systems via an in-band management network. Network interface 108 may enable information handling system 102 to communicate using any suitable transmission protocol and/or standard. In these and other embodiments, network interface 108 may comprise a network interface card, or "NIC." In some embodiments, network interface 108 may comprise a 10 gigabit Ethernet network interface. In these and other embodiments, network interface 108 may be enabled as a local area network (LAN)-on-motherboard (LOM) card. Network interface 108 may be configured to communicate via wire-line transmissions, wireless transmission, or both.

In addition to processor 103, memory 104, BIOS 105, and network interface 108, information handling system 102 may include one or more other information handling resources.

In operation, BIOS 105 may be configured, during a Pre-EFI Initialization (PEI) phase of the execution of BIOS 105, and before configuration of SMRAM 106, to perform testing, self-healing, and remediation of SMRAM 106, as described in greater detail below with respect to FIG. 2.

FIG. 2 illustrates a flowchart of an example method 200 for ensuring fault-resilience in SMRAM 106, in accordance with embodiments of the present disclosure. According to certain embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, upon restart, reset, or other initialization of information handling system 102, BIOS 105 may begin execution, including execution within the PEI phase. At step 204, during the PEI phase, BIOS 105 may determine if a flag to test SMRAM 106 was set during a previous boot session of information handling system 102. For example, in some embodiments, such a flag may be set in response to memory diagnostics tests being executed during the previous boot session, either on-demand (e.g., by a user) or by an automatic process such as a diagnostics program. As another example, in these and other embodiments, such a flag may be set in response to execution of an SMI exception handler (e.g., when a check occurs due to a memory fault) during the previous boot session. If the flag is set, method 200 may proceed to step 206. Otherwise method 200 may proceed to step 222.

At step 206, in response to the flag being set, BIOS 105 may, during the PEI phase, test the region of memory 104 designated for use by SMRAM 106. At step 208, BIOS 105 may, during the PEI phase, determine if the test indicated a fault or failure of the designated region for SMRAM 106. If a fault or failure is detected, method 200 may proceed to step 210. Otherwise, method 200 may proceed to step 216.

At step 210, in response to a fault or failure of the designated region, BIOS 105 may, during the PEI phase, increment an SMRAM failure count stored in a non-volatile memory associated with or otherwise accessible to BIOS 105. In addition, at step 212, BIOS 105 may, during the PEI phase, map out the failed designated region so that such region may not ever be used again by BIOS 105 or an operating system of information handling system 102. Further, at step 214, BIOS 105 may, during the PEI phase, choose and designate another region for SMRAM 106. After completion of step 214, method 200 may proceed again to step 208, at which BIOS 105 may test the newly-designated region.

At step 216, in response to the designated region of memory 104 passing the test, BIOS 105 may, during the PEI phase, configure the designated region of memory 104 that passed the test for use as SMRAM 106.

At step 218, BIOS 105 may, during the PEI phase, determine if the SMRAM failure count has reached a threshold level. If the threshold level has been reached, method 200 may proceed to step 220. Otherwise, method 200 may proceed to step 222.

At step 220, if response to the threshold level for the SMRAM failure count being reached, BIOS 105 may trigger a process to have a replacement memory module delivered to a user (e.g., administrator, owner, end user, etc.) of information handling system 102, such that the user may install the replacement memory module within information handling system 102 in place of an existing memory module of memory 104.

At step 222, BIOS 105 may complete its execution, and information handling system 102 may complete its boot process. After completion of step 222, method 200 may end.

Although FIG. 2 discloses a particular number of steps to be taken with respect to method 200, it may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using information handling system 102, components thereof or any other system operable to implement method 200. In certain embodiments, method 200 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising:
   a processor;
   a memory communicatively coupled to the processor; and
   a basic input/output system communicatively coupled to the processor and comprising a program of executable instructions configured to:
   maintain a System Management Random Access Memory (SMRAM) test flag indicative of a requirement to test a designated region of memory configured as an SMRAM for use in a System Management Mode (SMM) mode of operation; and
   during a Pre-Extensible Firmware Interface Initialization (PEI) phase of the basic input/output system, responsive to detecting that the SMRAM test flag is set:
      test the designated region and responsive to detecting a memory fault:
         map out the designated region and designate an additional region of the memory as a designated region for SMRAM; and
         repeat testing of additional designated regions, mapping out of failed additional designated regions, and designating new additional regions of the memory until a designated region passes testing without memory fault; and
      in response to detecting passage of testing without memory fault of a designated region comprising either of the first designated region or an additional region of the memory, configure the designated region for use as the SMRAM for the information handling system; and
      responsive to a system management interrupt (SMI), configure the information handling system to enter the SMM, in which the SMRAM is configured as a separate address space dedicated for executing SMM code.

2. The information handling system of claim 1, wherein the basic input/output system is further configured to, during the PEI phase:
   in response to detecting a memory fault in any of the first designated region and any additional region of the memory, increment a failure counter; and
   in response to the failure counter reaching a threshold level, cause delivery of a replacement memory module for the information handling system.

3. The information handling system of claim 1, wherein the flag is set in response to a memory diagnostics test being executed during the previous boot session.

4. The information handling system of claim 1, wherein the flag is set in response to execution of an SMI exception handler occurring during the previous hoot session.

5. A method comprising;
   maintaining a System Management Random Access Memory (SMRAM) test flag indicative of a requirement to test a designated region of memory configured as an SMRAM for use in a System Management Mode (SMM) mode of operation; and
   during a Pre-Extensible Firmware Interface Initialization (PEI) phase of a basic input/output system of an information handling system, responsive to detecting that the SMRAM test flag is set:
   testing the designated region responsive to detecting a memory fault:
      mapping out the designated region and designating an additional region of the memory as a designated region for SMRAM; and
      repeating testing of additional designated regions, mapping out of tidied additional designated regions, and designating new additional regions of the memory until a designated region passes testing without memory fault; and
   in response to detecting passage of testing without memory fault of a designated region comprising either of the first designated region or an additional region of the memory, configuring the designated region for use as the SMRAM for the information handling system; and
   responsive to a system management interrupt (SMI), configure the information handling system to enter the SMM, in which the SMRAM is configured as a separate address space dedicated for executing SMM code.

6. The method of claim 5, further comprising, during the PEI phase:
   in response to detecting a memory fault in any of the first designated region and any additional region of the memory, incrementing a failure counter; and
   in response to the failure counter reaching a threshold level, causing delivery of a replacement memory module for the information handling system.

7. The method of claim 5, wherein the flag is set in response to a memory diagnostics test being executed during the previous boot session.

8. The method of claim 5, wherein the flag is set in response to execution of an SMI exception handier occurring during the previous boot session.

9. An article of manufacture comprising:
a non-transitory computer-readable medium; and
computer-executable instructions carried on the computer-readable medium, the instructions readable by a processor, the instructions, when read and executed, for causing the processor to:
maintain a System Management Random Access Memory (SMRAM) test flag indicative of a requirement to test a designated region of memory configured as an SMRAM for use in a System Management Mode (SMM) mode of operation; and
during a Pre-Extensible Firmware Interface Initialization (PEI) phase of a basic input/output system of an information handling system, responsive to detecting that the SMRAM test flag is set:
test the designated region and responsive to detecting a memory fault:
map out the designated region and designate an additional region of the memory as a designated region for SMRAM; and
repeat testing of additional designated regions, mapping out of failed additional designated regions, and designating new additional regions of the memory until a designated region passes testing without memory fault; and
in response to detecting passage of testing without memory fault of a designated region comprising either of the first designated region or an additional region of the memory, configuring the designated region for use as the SMRAM for the information handling system; and
responsive to a system management interrupt (SMI), configure the information handling system to enter the SMM, in which the SMRAM is configured as a separate address space dedicated for executing SMM code.

10. The article of claim 9, the instructions for further causing the processor to, during the PEI phase:
in response to detecting a memory fault in any of the first designated region and any additional region of the memory, increment a failure cannier; and
in response to the failure counter reaching a threshold level, cause delivery of a replacement memory module for the information handling system.

11. The article of claim 9, wherein the flag is set in response to a memory diagnostics test being executed during the previous boot session.

12. The article of claim 9, wherein the flag is set in response to execution of an SMI exception handier occurring during the previous boot session.

* * * * *

UNITED STATES PATENT AND TRADEMARK OFFICE
CERTIFICATE OF CORRECTION

| | |
|---|---|
| PATENT NO. | : 11,984,183 B2 |
| APPLICATION NO. | : 17/590214 |
| DATED | : May 14, 2024 |
| INVENTOR(S) | : Samuel et al. |

It is certified that error appears in the above-identified patent and that said Letters Patent is hereby corrected as shown below:

In the Claims

In Column 8, Line 26, Claim 4, delete "previous hoot" and insert -- previous boot --, therefor.

In Column 8, Line 43, Claim 5, delete "out of tidied" and insert -- out of failed --, therefor.

In Column 9, Line 2, Claim 8, delete "exception handier" and insert -- exception handler --, therefor.

In Column 10, Line 16, Claim 10, delete "failure cannier" and insert -- failure counter --, therefor.

In Column 10, Line 24, Claim 12, delete "exception handier" and insert -- exception handler --, therefor.

Signed and Sealed this
Twenty-ninth Day of October, 2024

*Katherine Kelly Vidal*

Katherine Kelly Vidal
*Director of the United States Patent and Trademark Office*